(12) United States Patent
Liou et al.

(10) Patent No.: US 6,455,412 B1
(45) Date of Patent: Sep. 24, 2002

(54) SEMICONDUCTOR CONTACT VIA STRUCTURE AND METHOD

(75) Inventors: Fu-Tai Liou, Carrollton; Charles Ralph Spinner, Dallas, both of TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 07/741,645

(22) Filed: Aug. 6, 1991

Related U.S. Application Data

(60) Division of application No. 07/516,425, filed on Apr. 30, 1990, now Pat. No. 5,070,391, which is a continuation-in-part of application No. 07/443,898, filed on Nov. 30, 1989, now abandoned.

(51) Int. Cl.⁷ .................... H01L 21/4763; H01L 21/44; H01L 21/461
(52) U.S. Cl. .................... 438/625; 438/637; 438/648; 438/656; 438/672; 438/742; 438/970
(58) Field of Search ................ 437/192, 194, 437/203, 228, 190

(56) References Cited

U.S. PATENT DOCUMENTS

| | | | | |
|---|---|---|---|---|
| 3,499,213 A | * | 3/1970 | Domel et al. ............... | 437/192 |
| 4,720,908 A | * | 1/1988 | Wills ........................... | 437/192 |
| 5,110,762 A | * | 5/1992 | Nakahara et al. ............ | 437/192 |
| 5,141,897 A | * | 8/1992 | Manocha et al. ............ | 437/192 |

FOREIGN PATENT DOCUMENTS

| | | | | |
|---|---|---|---|---|
| GB | 2206234 | * | 12/1988 | .................. 437/192 |
| JP | 57-26431 | * | 2/1982 | .................. 437/192 |
| JP | 64-48447 | * | 2/1989 | .................. 437/192 |
| JP | 1-230253 | * | 9/1989 | .................. 437/197 |

OTHER PUBLICATIONS

Y. Panlean, "Interconnect Materials for VLSI circuits, Part II", Solid State Technology, Apr. 1987 pp. 155–162.*

* cited by examiner

*Primary Examiner*—Jerome Jackson, Jr.
*Assistant Examiner*—Shrinivas H. Rao
(74) *Attorney, Agent, or Firm*—Lisa K. Jorgenson; Daniel E. Venglarik

(57) ABSTRACT

A contact opening through an insulating layer is filled with metal and etched back to form a metal plug within the opening. A metal interconnect line can then be formed over the contact, and makes electrical contact with the metal plug. Since the contact opening is filled by the metal plug, it is not necessary for the metal signal line to have a widened portion in order to ensure enclosure.

20 Claims, 2 Drawing Sheets

SEMICONDUCTOR CONTACT VIA STRUCTURE AND METHOD

CROSS-REFERENCE TO RELATED APPLICATIONS

The present application is a division of U.S. Ser. No. 07/516,425 filed Apr. 30, 1990, now U.S. Pat. No. 5,070, 391, which is a continuation-in-part of U.S. Ser. No. 07/443, 898 filed Nov. 30, 1989 now abandoned, titled METHOD FOR FABRICATING INTERLEVEL CONTACTS, assigned to the assignee hereof, and which is incorporated by reference herein.

BACKGROUND OF THE INVENTION

1. Field of the Invention

The present invention relates generally to semiconductor devices, and more specifically to a structure and method for use in fabricating contacts between levels of a semiconductor device.

2. Description of the Prior Art

In semiconductor devices, metal lines are used for transmitting signals and for connection to the power supply. When a contact must be made to a lower conducting layer through an insulating layer, a contact via, or opening, must be formed through the intervening insulating layer.

In order to compensate for mask misalignment and other process variations, narrow metal lines are made larger at the point where they pass over a contact via. This is done since metal from the signal line must completely fill the bottom of the via. If the via is not completely filled, later process steps will affect the quality of the contact.

A minimum enclosure defines the extra surface area which must be added to a signal line in order to compensate for process variations. The widened portion is typically approximately twice the signal line width for small geometry devices. For example, if a device has metal signal lines with a 0.8 micron width, the region over a contact might be 2.0 microns wide. This enlarged area can be centered on the metal signal line, or may be offset to one side, and compensates for mask misalignment.

FIG. 7 shows a plan view of a typical prior art structure for making a contact through a via. A metal signal line 10 is designed to make contact to an underlying conducting layer through a contact via 12. A widened portion 14 of the signal line 10 is centered over the contact 12. The minimum enclosure is the distance 16 between the edge of the widened portion 14 and the edge of the contact via 12. Process variations may cause the actual alignment of the widened portion 14 to vary with respect to the contact via 12.

It would be desirable to provide a process for fabricating semiconductor devices, and a structure formed thereby, which ensures adequate metal contact through a contact opening while reducing the minimum enclosure requirement.

SUMMARY OF THE INVENTION

It is therefore an object of the present invention to provide a structure and method for fabricating contacts in semiconductor devices which allows minimum enclosure requirements to be reduced.

It is another object of the present invention to provide such a structure and method which provides high quality contacts.

It is a further object of the present invention to provide such a structure and method which minimizes added complexity to the process of fabricating contacts.

Therefore, according to the present invention, a contact opening through an insulating layer is filled with metal and etched back to form a metal plug within the opening. A metal interconnect line can then be formed over the contact, and makes electrical contact with the metal plug. Since the contact opening is filled by the metal plug, it is not necessary for the metal signal line to have a widened portion in order to ensure enclosure.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

The method described herein is illustratively depicted as making a contact to a conductive region of an underlying silicon substrate. As will be appreciated by those skilled in the art, the same techniques can be used to fabricate a contact between an upper metal level of interconnect and an underlying level of polycrystalline silicon interconnect, or between two metal interconnect layers.

Figure 1:
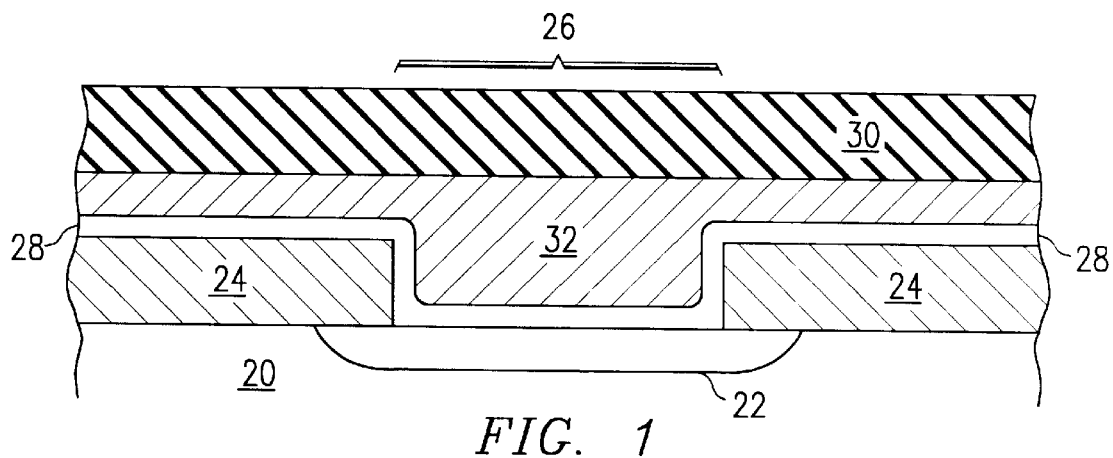
FIGS. 1–4 illustrate two methods for fabricating a semiconductor device contact according to the present invention.

Referring to FIG. 1, a semiconductor substrate 20 contains an active region 22 to which electrical contact is desired. An insulating layer of silicon dioxide 24 overlies the substrate 20. A contact via 26 is made through the insulating layer 24.

A layer 28 of refractory metal is deposited over the surface of the device. This layer 28 can have a thickness varying from approximately 100 angstroms to more than 3000 angstroms. The layer may consist of a refractory metal such as titanium, molybdenum, or niobium. Alternatively, an alloy or compound containing a refractory metal, such as titanium/tungsten, titanium nitride, or molybdenum silicide may be used. A sandwich structure of refractory metal/ refractory metal compound/refractory metal can be used, such as Ti/TiN/Ti.

A layer of aluminum 30 is then deposited over the surface of the device. This layer is deposited at an elevated temperature of at least approximately 150° C. A higher deposition rate of aluminum can be used at higher temperatures, so the aluminum layer 30 is preferably deposited at a temperature between approximately 350° C. and 500° C., preferably at a rate of approximately 20 to 200 angstroms/ sec. In addition to the higher deposition rate, the higher temperatures increase the surface mobility of the deposited aluminum, increasing the amount of aluminum deposited in the contact opening 26.

Figure 2:
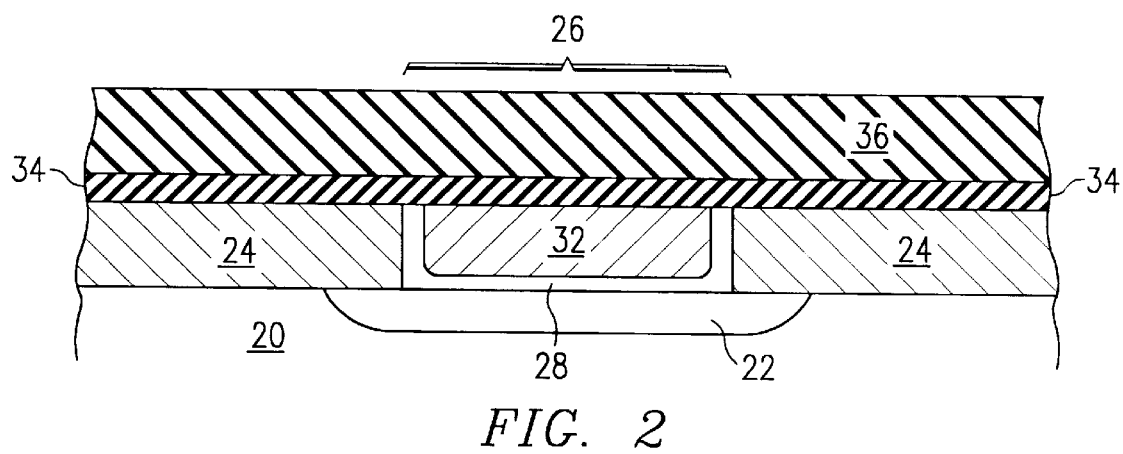

Depositing the aluminum layer 30 at such an elevated temperature causes it to alloy with the refractory metal layer 28 to form an aluminum/refractory metal alloy layer 32. As described in co-pending patent application Ser. No. 443,898, titled METHOD FOR FABRICATING INTERLEVEL CONTACTS, the volume of the alloy is greater than that of aluminum alone, so that the contact opening 26 is filled without the formation of voids, and the aluminum layer 30 is relatively planar. Referring to FIG. 2, the just formed aluminum 30 and alloy 32 layers are etched back. The etch continues until the insulating layer 24 is exposed, thereby also removing portions of the refractory metal layer 28. This leaves a metal plug within the contact opening 26 consisting of a thin layer of refractory metal 28 and an aluminum/refractory metal alloy 32.

A layer 34 of refractory metal is then formed over the surface of the device. Refractory metal layer 34 is preferably tungsten, and is preferably sputtered onto the device to a thickness of between 200 and 2000 angstroms. Other metals may be used for refractory metal layer 34, with any material which can be selectively etched with relation to aluminum being suitable. An aluminum layer 36 is then deposited over the surface of the chip. The aluminum layer 36 may be alloyed with other materials, such as silicon and copper, as known in the art.

Figure 3:
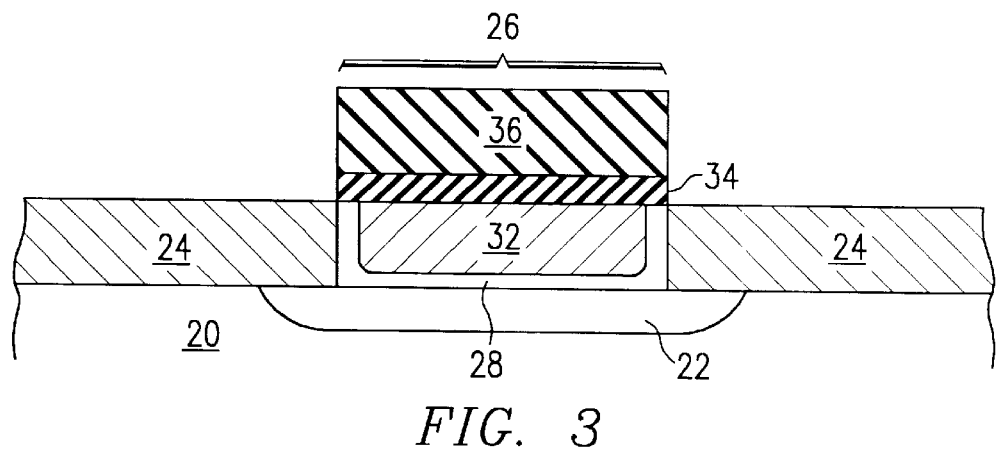

Referring to FIG. 3, the aluminum layer 36 is patterned and etched to form interconnect using the tungsten layer 34 as an etch stop. The tungsten layer 34 is then selectively etched over aluminum. The aluminum interconnect layer 36 can be used as the etch mask for this stage if desired. The tungsten should be etched selectively over the insulating layer 24, and the refractory metal layer 28 and aluminum alloy layer 32 within the contact opening. Thus, the layers 28, 32 act as an etch stop for the tungsten layer 34. This causes the tungsten layer 34 to be completely etched away without causing any damage to the plug within the contact opening 26. Although FIG. 3 shows a precise alignment between the interconnect level formed by the aluminum tungsten 36 and 34, this may not be the case in actual processing.

Since a planar surface is available for deposition of the tungsten 34 and aluminum layers 36, due to the plug within the contact opening 26, high quality contacts are made between the interconnect layer and the underlying active region 22. Since metal is used for the interconnect layer and the plug, even a large misalignment between the interconnect layer and the contact opening 26 allows a high quality contact to be formed.

Figure 4:
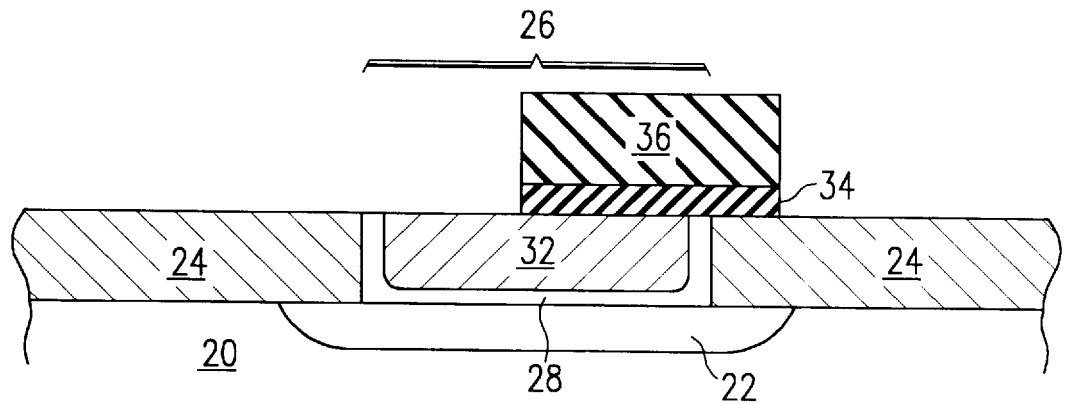

FIG. 4 illustrates a structure formed as described above in which the width of the signal line formed by layers 34 and 36 is less than the size of the contact opening 26. In addition, FIG. 4 illustrates the situation which can occur when mask alignment errors occur during processing. Since tungsten layer 34 protected the layers 28 and 32 during patterning of the aluminum layer 36, a complete etch of aluminum layer 36 could be performed without fear of damaging the underlying metal plug. The tungsten layer 34 is then removed without damaging the metal regions 28, 30 within the contact opening 26. Since a metal-to-metal contact occurs between the interconnect layer and the plug, the quality of the contact is still good, allowing a high quality contact to be made between the interconnect layer 34, 36 and the active region 22 beneath.

As will be appreciated by those skilled in the art, the technique described above can also be used to make contact to underlying interconnect layers made of polycrystalline silicon or metal.

Figure 5:
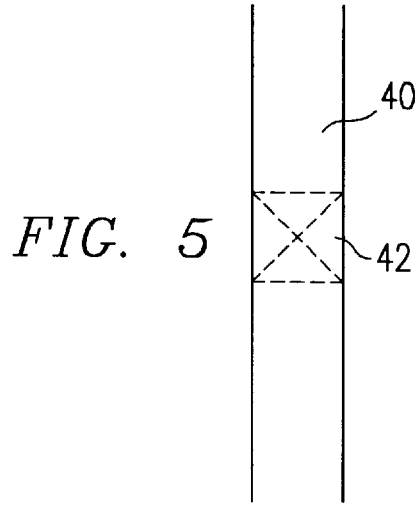
FIGS. 5 and 6 are plan views of contacts formed according to the present invention.

Referring to FIG. 5, a plan view of a metal signal line 40 passing over a contact via is shown in which the dimensions of the contact via 42 are the same as the width of the signal line 40. FIG. 5 shows the signal line 40 in perfect alignment with the contact via 42, but, for the reasons described above, the structure is relatively insensitive to misalignment.

Figure 6:
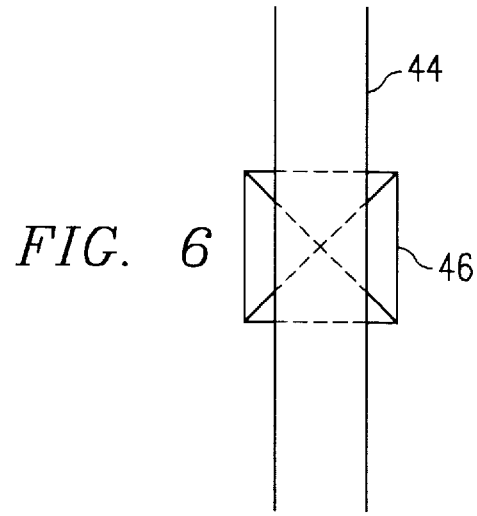
Figure 7:
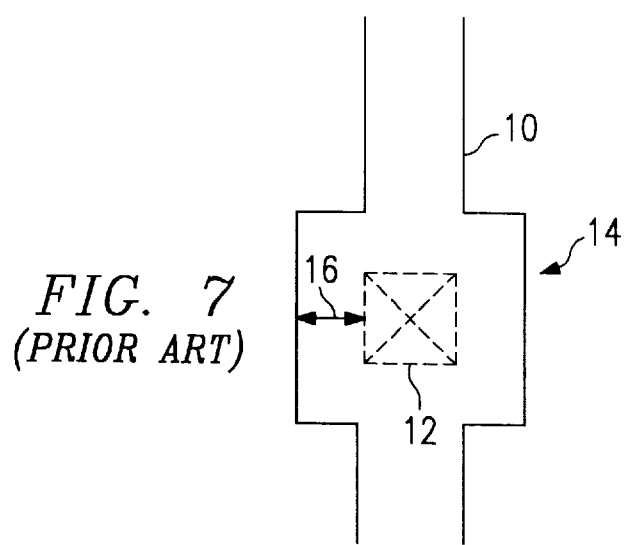
FIG. 7 is a plan view of a prior art contact.

FIG. 6 shows a metal signal line 44 which has a width less than the dimensions of the contact via 46. If a fairly large misalignment of the signal line 44 is possible, and there is room for a large contact via 46, this type of structure can be fabricated to be even less sensitive to interconnect mask misalignment than is the case with FIG. 5. The plan view of FIG. 5 corresponds with the cross-sectional view of FIG. 3, while the plan view of FIG. 6 corresponds approximately to the cross-sectional view of FIG. 4, with the difference that mask misalignment did not occur in FIG. 6.

As will be appreciated by those skilled in the art, a method and structure has been described by which a metal plug can be fabricated within a contact via, and connection made to an overlying metal interconnect layer. The described technique is relatively insensitive to mask misalignment, and allows metal signal lines having the minimum possible width to be formed. Since widened regions 14 do not need to be formed, the metal signal lines can be formed closer together. With very small device geometries, this can increase device density on an integrated circuit device.

In addition, a very high quality contact is formed between the metal interconnect layer and an underlying substrate or interconnect layer. The metal interconnect layer thus formed in very planar, eliminating coverage problems which can occur due to the step formed by contact openings.

While the invention has been particularly shown and described with reference to a preferred embodiment, it will be understood by those skilled in the art that various changes in form and detail may be made therein without departing from the spirit and scope of the invention.

What is claimed is:

1. A method for forming a contact in an integrated circuit device, comprising the steps of:

forming an opening in an insulating layer having an upper surface;

forming a refractory metal barrier layer on the insulating layer upper surface and sides and bottom of the opening;

forming an aluminum layer over the insulating layer upper surface and the sides and the bottom of the opening under conditions producing an aluminum/refractory metal alloy layer between the refractory metal barrier layer and the aluminum layer;

etching back the aluminum layer, the aluminum/refractory metal alloy layer and the refractory metal barrier layer to expose the insulating layer upper surface, and thereby form a metal plug filling the opening and having an upper surface approximately coplanar with the insulating layer upper surface;

forming a second refractory metal barrier layer over the plug upper surface and the insulating layer upper surface;

forming a second aluminum layer over the second refractory metal barrier layer;

etching the second layer of aluminum to define a signal line, wherein the second aluminum layer is etched selectively over the second refractory metal barrier layer; and etching the second refractory metal barrier layer selectively over the plug to complete definition of the signal line.

2. The method of claim 1, wherein the refractory metal barrier layer includes titanium.

3. The method of claim 1, wherein the refractory metal barrier layer comprises titanium nitride.

4. The method of claim 1, wherein the second metal is a refractory metal.

5. A method for forming a contact in an integrated circuit device, comprising the steps of:

forming an opening in an insulating layer having an upper surface;

forming a region of first aluminum metal filling the opening, such region defining a metal plug and having an upper surface approximately coplanar with the insulating layer upper surface;

forming a layer of tungsten over the metal plug upper surface and the insulating layer upper surface;

forming a second layer of the first aluminum metal over the tungsten layer;

etching the second layer of first aluminum metal to define a signal line, wherein the first aluminum metal is etched selectively over the tungsten; and etching the layer of tungsten selectively over the first aluminum metal of the plug to complete definition of the signal line.

6. The method of claim 1, wherein the defined signal line has a width large enough to cover the entire opening in the insulating layer.

7. The method of claim 6, wherein the defined signal line has a width approximately the same as a dimension of the opening in the insulating layer.

8. The method of claim 1, wherein the defined signal line has a width less than a dimension of the opening in the insulating layer.

9. The method of claim 1, wherein the region of aluminum filling the opening contacts an underlying conductive region.

10. The method of claim 9, wherein the underlying conductive region is in a substrate of the device.

11. A method for forming a contact in an integrated circuit device, comprising the steps of:

forming an insulating layer having an upper surface;

forming an opening through the insulating layer, such opening exposing an underlying conducting region therethrough;

forming a refractory metal barrier layer on the sides and bottom of the opening;

forming an aluminum layer over the surface of the device, wherein an aluminum/refractory metal alloy is formed within the opening as the aluminum is deposited;

etching back the aluminum layer, aluminum/refractory metal alloy and refractory metal barrier layer to expose the insulating layer upper surface and thereby form a conductive plug which fills the opening and has an upper surface which is approximately coplanar with the insulating layer upper surface;

forming a conductive etch stop layer over the insulating layer upper surface;

forming a conductive layer over the conductive etch stop layer;

etching the conductive layer in a pattern to form an interconnect, wherein the conductive layer is selectively etched over the conductive etch stop layer; and etching the conductive etch stop layer in the pattern used to form the interconnect, wherein the conductive etch stop layer is selectively etched over the conductive plug.

12. A method for forming a contact in an integrated circuit device, comprising the steps of:

forming an insulating layer having an upper surface;

forming an opening through the insulating layer, such opening exposing an underlying conducting region therethrough;

forming a conductive plug which fills the opening and has an upper surface which is approximately coplanar with the insulating layer upper surface;

forming a conductive etch stop layer over the insulating layer upper surface and the conductive plug upper surface;

forming a conductive layer over the conductive etch stop layer;

etching the conductive layer in a pattern to form an elongate conductive signal line, wherein the conductive layer is selectively etched over the conductive etch stop layer; and etching the conductive etch stop layer in the pattern used to form the elongate conductive signal line, wherein the conductive etch stop layer is selectively etched over the conductive plug.

13. The method of claim 12, wherein the signal line has a width not greater than approximately a minimum dimension of the opening.

14. The method of claim 13, wherein the signal line has a width less than the minimum dimension of the opening.

15. The method of claim 12, wherein the opening has sides defining a polygon in the insulating layer upper surface.

16. The method of claim 15, wherein the polygon is a regular polygon.

17. The method of claim 16, wherein the polygon is a rectangle.

18. The method of claim 15, wherein the signal line has a width not greater than approximately a length of a side of the polygon.

19. The method of claim 18, wherein the signal line has a width not greater than approximately a length of a shortest side of the polygon.

20. The method of claim 19, wherein the signal line has a width less than the length of the shortest side of the polygon.

* * * * *